United States Patent
Mezouari et al.

(10) Patent No.: US 10,381,507 B2
(45) Date of Patent: Aug. 13, 2019

(54) LIGHT EMITTING DIODE CHIP AND A METHOD FOR THE MANUFACTURE OF A LIGHT EMITTING DIODE CHIP

(71) Applicant: Plessey Semiconductors Limited, Plymouth, Devon (GB)

(72) Inventors: Samir Mezouari, Plymouth (GB); John Whiteman, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 38 days.

(21) Appl. No.: 15/558,603

(22) PCT Filed: Mar. 16, 2016

(86) PCT No.: PCT/EP2016/055638
§ 371 (c)(1),
(2) Date: Sep. 15, 2017

(87) PCT Pub. No.: WO2016/146658
PCT Pub. Date: Sep. 22, 2016

(65) Prior Publication Data
US 2018/0083156 A1    Mar. 22, 2018

(30) Foreign Application Priority Data
Mar. 16, 2015   (EP) ..................... 15159275

(51) Int. Cl.
*H01L 33/00* (2010.01)
*H01L 33/20* (2010.01)
(Continued)

(52) U.S. Cl.
CPC ............ *H01L 33/007* (2013.01); *H01L 33/20* (2013.01); *H01L 33/50* (2013.01); *H01L 33/58* (2013.01); *H01L 33/04* (2013.01)

(58) Field of Classification Search
None
See application file for complete search history.

(56) References Cited

U.S. PATENT DOCUMENTS

2010/0244065 A1* 9/2010 Butterworth .......... H01L 33/007
257/98
2012/0153333 A1 6/2012 Yamazaki et al.
(Continued)

FOREIGN PATENT DOCUMENTS

EP    0042484 A2   12/1981

OTHER PUBLICATIONS

International Search Report and Written Opinion issued in PCT/EP2016/055638, dated Apr. 22, 2016, 12 pages.
(Continued)

*Primary Examiner* — Long Pham
(74) *Attorney, Agent, or Firm* — Stinson LLP

(57) ABSTRACT

A method for the manufacture of a light-emitting diode (LED) chip, the method comprising providing a first substrate; forming an LED structure on the first substrate, wherein the LED structure has a first surface adjacent the first substrate and a second surface opposite the first substrate; applying a second substrate on the second surface of the LED structure; and selectively etching the first substrate from the LED structure to form one or more walls extending from the first surface of the LED structure.

16 Claims, 16 Drawing Sheets

(51) Int. Cl.
*H01L 33/50* (2010.01)
*H01L 33/58* (2010.01)
*H01L 33/04* (2010.01)

(56) References Cited

U.S. PATENT DOCUMENTS

2013/0048940 A1   2/2013   Sills et al.
2014/0034984 A1   2/2014   Schweeger et al.
2014/0231842 A1   8/2014   Akimoto et al.
2014/0348197 A1  11/2014   Freund
2015/0060902 A1   3/2015   Cheng et al.

OTHER PUBLICATIONS

European Search Report and Written Opinion dated in EP 15159275, dated Jul. 28, 2015, 7 pages.

\* cited by examiner

LIGHT EMITTING DIODE CHIP AND A METHOD FOR THE MANUFACTURE OF A LIGHT EMITTING DIODE CHIP

REFERENCE TO RELATED APPLICATIONS

This application is a U.S. national stage application of International Patent Application No. PCT/EP2016/055638, filed Mar. 16, 2016, and claims the benefit of priority of European Patent No. 15159275.5, filed Mar. 16, 2015, the entire disclosures of which are incorporated herein by reference.

FIELD OF THE INVENTION

This disclosure relates to a method of manufacturing a light-emitting diode chip, in particular a light emitting diode chip with controlled light beam emission.

BACKGROUND

Light emitting diode (LED) chips emit a wide angular beam of light either from only a single top surface or from a plurality of surfaces. This results in a full beam angle which is at least 180 degrees wide. Since LEDs commonly emit a narrow spectrum of light it is necessary to use phosphor materials to convert the light emitted from the LED chip into a broader spectrum and higher wavelength (white light for instance).

For a number of lighting applications there is a requirement for a narrow beam of light. In some of these instances, space is also at a premium, for instance flash camera phones. In order to achieve a narrow beam of light in such instances, expensive low profile secondary optics are needed.

Conventional light emitting diodes allow heat dissipation through the surface area that is opposite to the top emitting surface area of the chip. The quantum wells layer where the heat is generated is separated from the heat dissipation area by a relatively thick carrier substrate (70 µm to 350 µm). As a result the thermal resistance of the LED chip is undesirably high.

An example of a method of manufacturing an LED chip (100) is provided in FIG. 1. In this example, layers of GaN are grown on a first substrate (105) which is made from silicon. The GaN layers consist of an n-type doped GaN layer (110), a layer comprising plurality of quantum wells (115) and p-type doped GaN layer (120) and is fabricated to include an n-GaN electrical contact (125), sidewall passivation (130) and a reflective p-GaN electrical contact (135) (see FIG. 1A). A second substrate (140), made from a silicon wafer, is bonded to the fabricated GaN structure using a permanent, conductive adhesive (145) (see FIG. 1B).

The original growth substrate is removed, allowing the fabricated GaN structure to be flipped and processed such that the surface is textured (150) (See FIG. 10). The completed LED structure is then tested, singulated and placed into a package where connections to the anode are made by way of a wire bond and to the cathode by way of a conductive adhesive.

Most common method to dispense a phosphor material over an LED chip is to assemble the LED chip into a carrier/submount that contains a dam around the LED chip so the phosphor material can be well controlled and evenly dispensed. However, the assembly of the LED chip into a carrier comes at a relatively high cost.

Examples of collimating light are provided in, for example, U.S. Pat. No. 8,076,831. The method of U.S. Pat. No. 8,076,831 involves the shaping of monochromatic light. When phosphor is applied, light is scattered by the particles in the phosphor solution, thereby undoing any pre-collimation. In order to focus the light to a spot or shape the light, secondary optics are employed which are expensive, typically costing many times more than the LED. Secondary optics can then be attached to the surface of the package or placed around the package to collimate the light for the purpose of directing a light beam, in accordance with the requirements of the final application. Coupling light into secondary optics is an inefficient process as it comes with unavoidable optical losses.

Another solution (as described in WO2009022316) consists of mounting the LED chip on a submount with an optical element in the form of a reflector. Alternatively, the reflector may be part of a molded lead frame. The molded lead frame may be conventionally produced, e.g., from a patterned conductor materials, such as copper. Plastic is injection molded around the conductor material to form the molded lead frame, and is also molded to form the optical element, e.g., reflector.

Low profile secondary optics are used to collimate the emitted light into a narrow beam but because of their relatively small pupil aperture, they suffer from lower performance, particularly when the size of the pupil aperture is only few times the size of the LED chip. In addition, high alignment tolerances are necessary between the LED chip and the optical axis of the secondary optical component.

US2010/244065 relates to a semiconductor light emitting device grown on an etchable substrate.

US2014/034984 relates to a semiconductor light emitter device.

US2013/048940 relates to solid state radiation transducers and methods of manufacturing.

US2014/348197 relates to a semiconductor optical emitting device with lens structure formed in a cavity of a substrate of the device.

EP0042484 relates to high radiance LEDs.

US2015/060902 relates to a package of light emitting diode chips.

US2012/153333 relates to a light-emitting device utilizing organic electroluminescence (EL).

US2014/231842 relates to a semiconductor light emitting device and light emitting device.

Accordingly, it is desirable to provide an improved method of forming an LED chip and/or tackle at least some of the problems associated with the prior art or, at least, to provide a commercially useful alternative thereto.

SUMMARY OF THE INVENTION

In a first aspect the present disclosure provides a method for the manufacture of a light-emitting diode (LED) chip, the method comprising providing a first substrate; forming an LED structure on the first substrate, wherein the LED structure has a first surface adjacent the first substrate and a second surface opposite the first substrate; applying a second substrate on the second surface of the LED structure; and selectively etching the first substrate from the LED structure to form one or more walls extending from the first surface of the LED structure.

DETAILED DESCRIPTION OF PREFERRED EMBODIMENTS

Figure 1A:
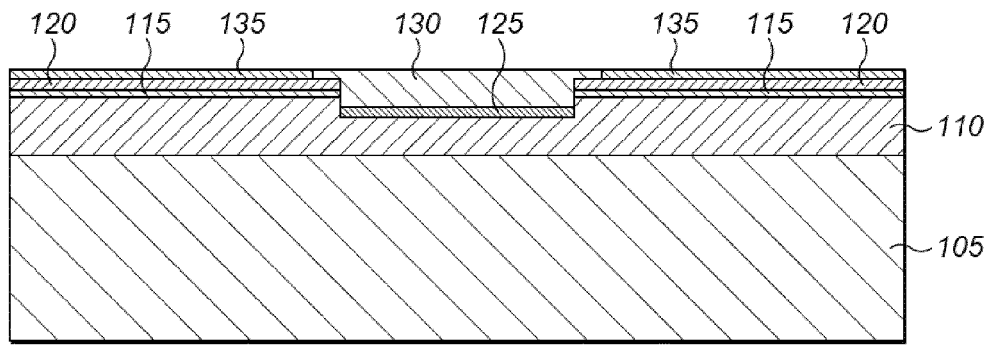
FIGS. 1A-C show a cross-section of the structures in the different steps during manufacture of an LED, which is not within the scope of the present invention.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The following description uses the term light-emitting diode (LED) structure to refer to the semiconductor structure which produces and emits light when electrical contacts are present and a potential difference is applied. The LED structure, therefore, typically comprises at least a p-type and an n-type layer sandwiched together, preferably with a layer comprising multiple quantum wells sandwiched therebetween. Reference to the LED structure does not include any electrodes.

The term light-emitting diode (LED) chip is used to refer to the semiconductor component including the LED structure and the further aspects required to permit the generation of light as desired when a potential difference is applied. Therefore, the term includes for example, electrodes, supporting substrates, the walls as described herein, passivation layers and any added phosphors and transparent material layers.

The term light-emitting diode (LED) device is used to refer to the device including the light-emitting diode chip, together with the requisite electrical connections and any protective coating required to permit the device to be used in an electrical device or, for example, soldered to a PCB.

The LED chip may comprise multiple LED structures and may be divided into a plurality of smaller chips before these are included into an LED device. Alternatively the LED chip may comprise multiple LED structures which can be separately connectable and separately addressable when included in a single LED device.

The method as described herein provides wall structures on the first surface. These act to control the light emitted from the first surface, either by absorbing the light or by reflecting the light, especially where a reflective coating is provided on the wall facing the light emission surface. In addition, the walls can be used to form enclosures to guide or collimate the light. These enclosures can also perform a dual function of holding wavelength conversion materials (such as phosphors) and lens material. Since the walls are formed from the substrate on which the LED structure is formed, they are easy to make, integrally attached and the method is efficient and cost effective.

In particular, the inventors have found that the method is particularly advantageous because it produces a device where no additional components are required to collimate or shape the emitted light from the LED chip into a full beam angle of less than 180 degree. Moreover, since the manufacture of the LED chip relies on the use of elements already present in the manufacture of the device, there is a particularly low cost and cycle time associated with the manufacturing process.

The ability to collimate the light is especially advantageous for demanding applications where high precision beam patterns are needed requiring secondary optics; the optics design can be considerably simplified by pre-shaping the emitted light beam from the LED chip to meet a required specification.

Figure 1B:
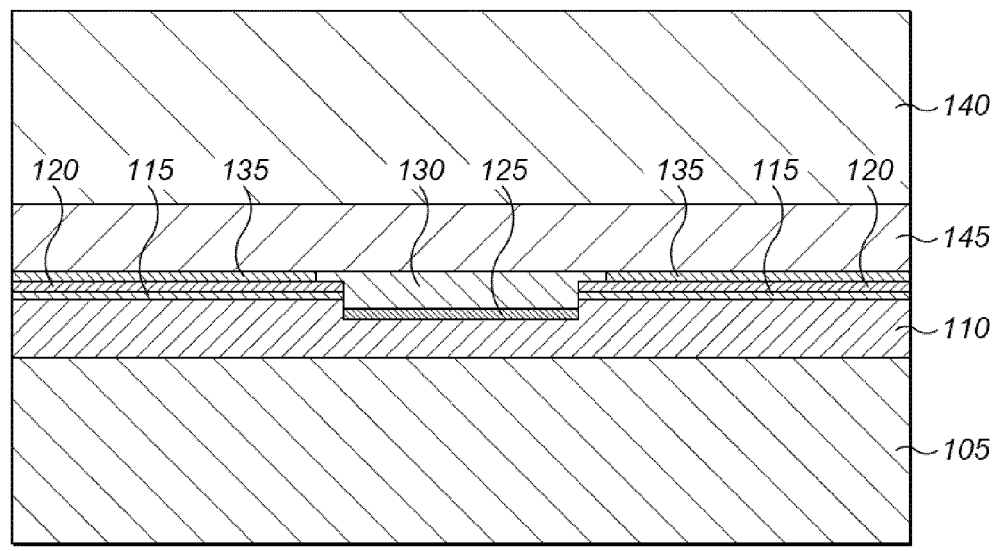
Figure 1C:
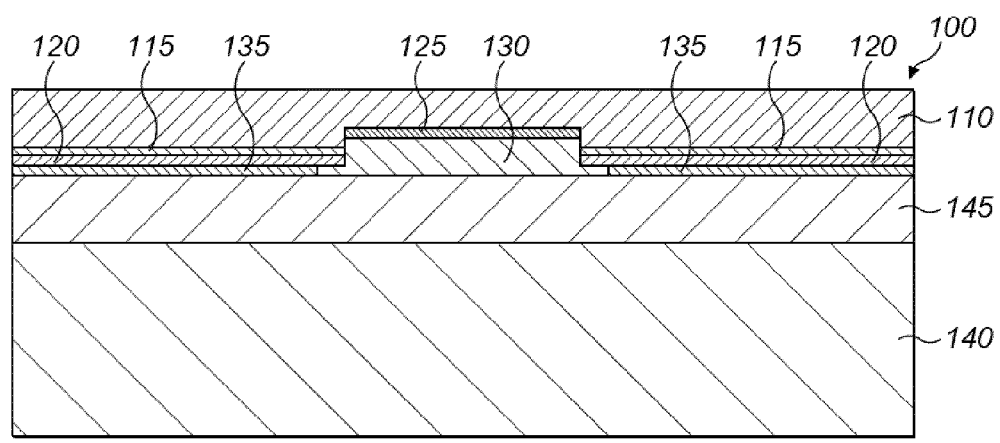
Figure 2A:
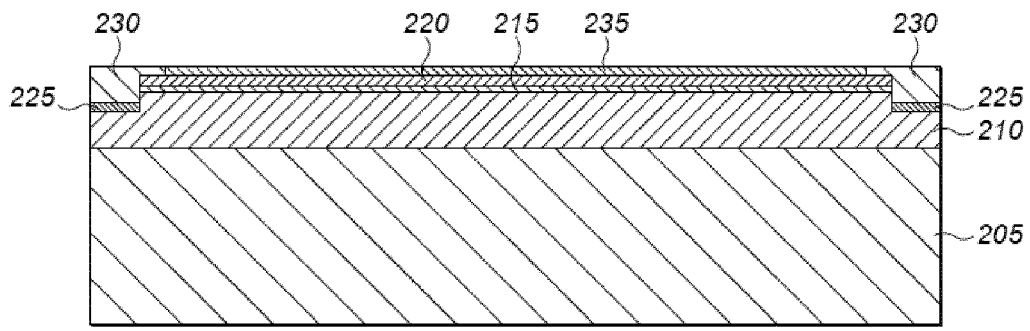
FIGS. 2A-D show a cross-section of the structures in the different steps during manufacture of an LED.
Figure 2B:
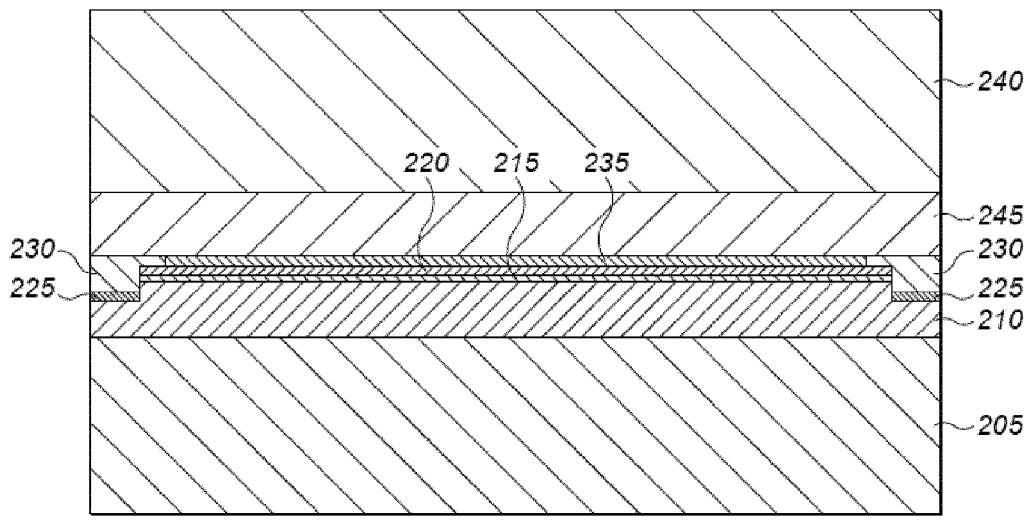
Figure 2C:
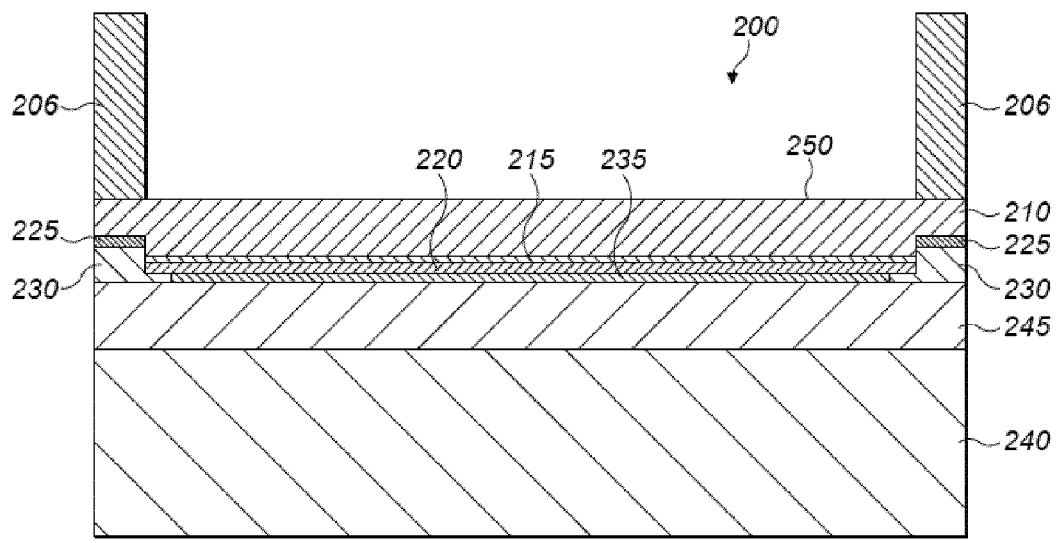
Figure 2D:
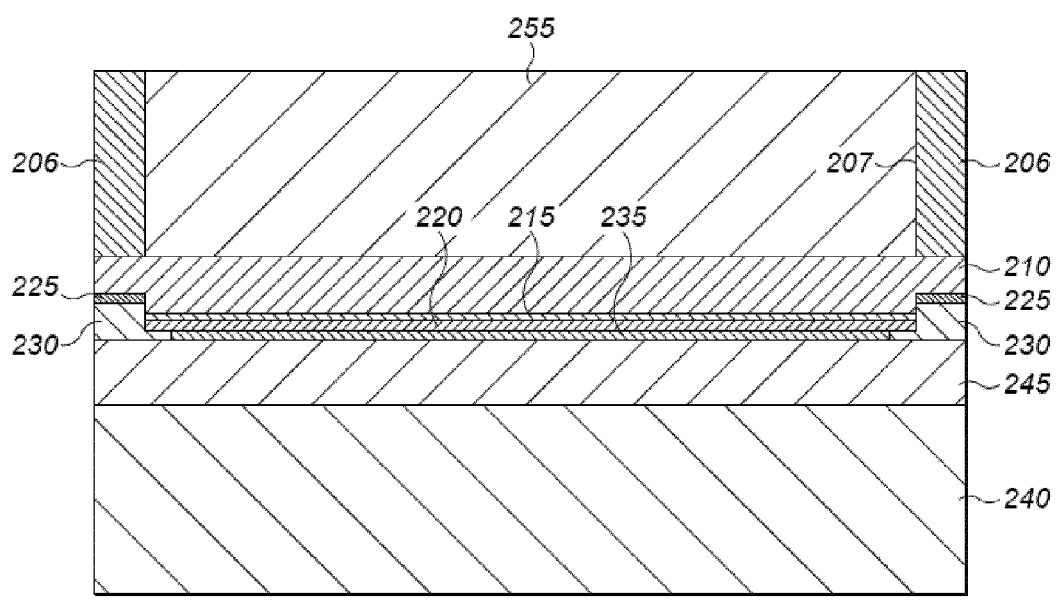

A further advantage relates to the management of the heat produced in the final LED device. In a conventional device, such as the one shown in FIGS. 1A-C, the heat produced is conducted away through the second substrate (140) only, whereas the silicon-based walls (206) formed from the first substrate (205) can also be used as a means to dissipate heat away from the junction layer of LED chip. This helps to reduce the thermal resistance of the device.

The method comprises a number of steps including providing a first substrate. The first substrate may comprise silicon, sapphire, SiC. InP, or GaAs.

It is most preferred that the first substrate is silicon. Silicon is preferred because it is a cost effective material and can be readily etched away. Furthermore, it is an excellent conductor of heat and helps to conduct heat away from the LED structure. In addition, when making an LED chip which can produce IR frequency light, the use of silicon is preferred because it is reflective at these frequencies. This avoids the need for reflective or mirror surfaces.

The method further comprises forming an LED structure on the first substrate. Preferably the LED structure is formed directly on the first substrate, although one or more strain-relieving layers may additionally be included to avoid lattice strain between the substrate and the LED structure. Any strain-relieving layers may desirably be etched from the device, as described below, together with those portions of the first substrate when it is selectively etched.

The LED structure will comprise sequentially formed layers including at least a p-type layer and an n-type layer. Preferably the LED structure comprises a light emitting layer disposed between a p-type layer and an n-type layer. The light emitting layer preferably comprises multiple quantum wells (MQW).

Preferably the p-type layer and/or the n-type layer comprises doped GaN. Other compound semiconductor materials may also be used in the layers and the formation of suitable LED structures, such as by epitaxy, is well known in the art.

Preferably the LED chip consists of those elements described herein. That is, preferably the LED chip consists of an LED structure, first and second substrates (in-so-far as either remains after etching), optionally an adhesive to bond the second substrate to the LED structure, and electrodes as discussed herein. That is, preferably there are no additional layers included.

Preferably the LED structure is for the emission of IR light. However, the LED structure can be selected to produce any desired frequency of light, by tuning the constituent layers of the LED structure.

The LED structure has a first surface adjacent the first substrate and a second surface opposite the first substrate. Preferably the n-type layer is adjacent the first substrate.

A second substrate is applied on the second surface of the LED structure. The method of application is not especially limited and may include the use of an adhesive such as, for example, a metal eutectic bond, ionic bond, glass frit bond, vacuum bond, conductive epoxy, or a non-conductive epoxy. Preferably the adhesive is conductive as this facilitates the formation of an electrical contact.

The second substrate may be formed of the same materials as the first substrate. In addition, since the second substrate does not need to be formed by epitaxy, the second substrate may be formed of germanium or copper. It is most preferred that the second substrate comprises silicon.

The method further comprises selectively etching the first substrate from the LED structure to form one or more walls extending from the first surface of the LED structure. The walls are formed out of the material of the first substrate which remains on the surface after the selective etching.

Preferably the selective etching comprises inductively coupled plasma etching and/or reactive ion etching. Preferably the etching process comprises first forming a pattern with a photosensitive media and then etching the unprotected material from the surface. The etching technique may be a wet or dry etching process. Such techniques are well known in the art. Etch techniques to vary the etch angle are well known in the industry and may involve changing gas flows, etch pressure and RF power.

Preferably the walls form enclosures on the surface of the first surface, i.e. areas that are at least partially surrounded by a barrier. The areas which are at least partially enclosed do not have any of the first substrate remaining on the surface, such that emitted light can escape. The walls serve to guide the light emitted.

Preferably the walls form complete enclosures, such that the enclosed area is a well formed by the walls and the bottom of the well exposes the first surface so that emitted light can escape.

The walls are preferably linear. This permits ready etching and allows the formation of a regular array of enclosures on the first surface. The regular array may then be singulated by dividing the chip longitudinally along the line of the walls to form individual LED chips with a circumferential wall. It is preferred that the walls define square or rectangular enclosures. The application will determine whether the walls are linear. Narrow beams will require circular openings packed in a hexagonal close packed array or a square array. Other beam shaping or phosphor dam techniques are likely to require linear structures to be formed. Die singulation is preferably achieved using a diamond blade saw or laser scribe method. Such techniques are well known in the art.

The walls may be at an angle normal to the first surface through which light is to be emitted. Alternatively the walls may be at an angle to the normal, preferably such that the enclosure widens with increasing distance from the first surface. The angle of the wall may be a constant angle $\alpha$, or the surface may have portions having different angles relative to the normal. The angle serves to control the shaping of the light emitted. The angle $\alpha$ is preferably from 5 to 45° from the normal, more preferably from 10 to 30° and most preferably about 20°.

The walls which form enclosures may be provided with asymmetric wall heights to provide angled light areas. Preferably the enclosure walls have a height of 100 to 1000 microns from the first surface and preferably the height of the walls is constant. Preferably the walls have a height of from 200 to 900 microns, more preferably from 300 to 800 microns. The thickness of the walls, measured parallel to the second substrate, preferably fall within 50 to 300 microns, although the specific value will vary across the height of the wall if the walls taper. The ratio of the wall width to the wall height preferably is from 1:2 to 1:4, more preferably about 1:3. When a chip is singulated along the line of a wall, the wall thickness may initially be double the final wall thickness.

The area of the first surface of the LED structure exposed by removal of a portion of the first substrate is typically 100 $\mu m^2$ (One hundred square microns) to 200,000 $\mu m^2$, and preferably, 10,000 $\mu m^2$ to 100,000 $\mu m^2$.

Preferably the method further comprises a step of forming first and second electrodes. This step is preferably before the step of selectively etching the first substrate from the LED chip. The first electrode is preferably in electrical connection with an n-type layer of the LED structure. The second electrode is preferably in electrical connection with a P-type layer of the LED structure.

One of the electrodes may be transparent to facilitate the emission of light from the chip. One of the electrodes may be reflective to act as a mirror on an internal surface of the LED chip.

Preferably the first electrode is provided in contact with the n-type layer formed on the first substrate and comprises Ti and/or Al. The first electrode may alternatively comprise Pd, Mo, In, Pt or TCO. Such electrodes are well known in the art.

Preferably the second electrode is provided in contact with the p-type layer of the LED structure. Second electrode is preferably reflective. The second electrode preferably comprises Ni and/or Ag. The second electrode may alternatively comprise ITO and Ag or another TCO or DBR structure. Such electrodes are well known in the art.

Figure 12:
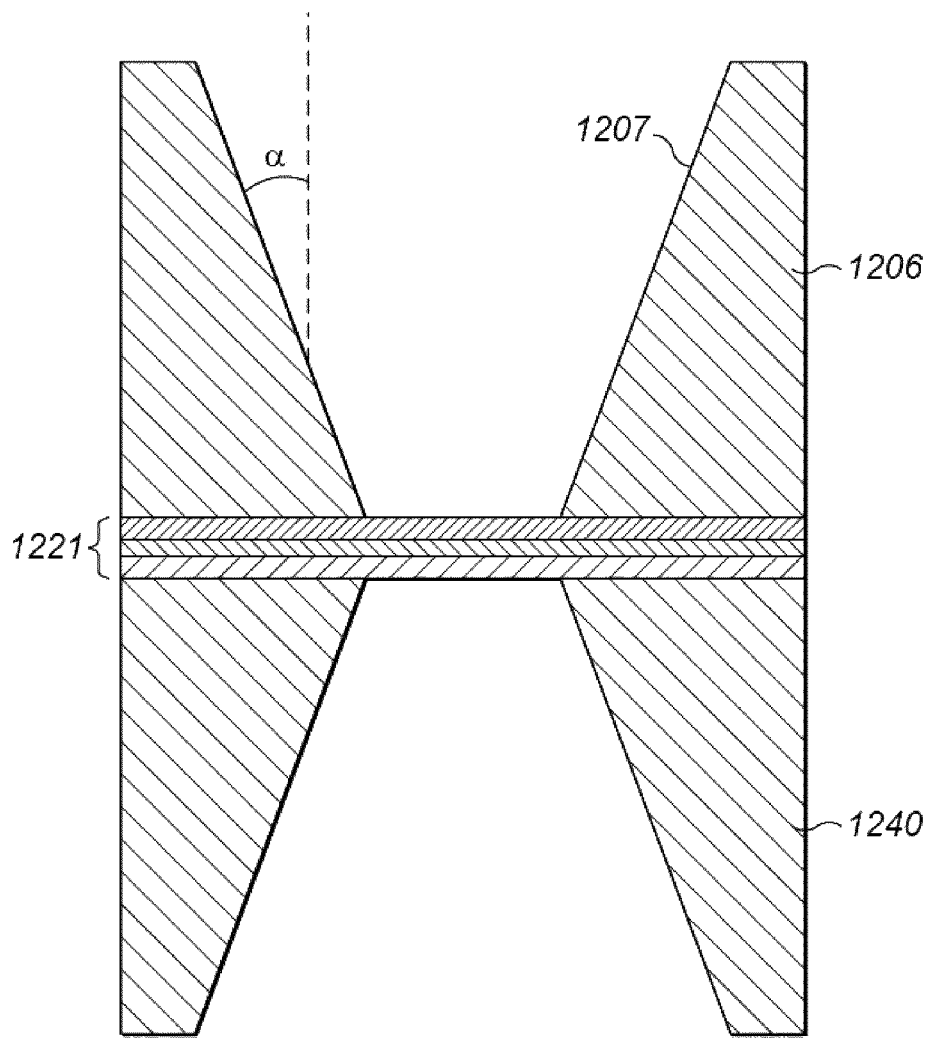
FIG. 12 shows a simplified cross-section of a final structure for an exemplary LED chip where the light produced can escape from upper and lower surfaces.

Preferably the method further comprises a step of selectively etching the second substrate from the LED structure to form one or more walls extending from the second surface of the LED structure. Such an embodiment is shown in FIG. 12. This means that the light generated within the LED structure can escape from both sides. This embodiment allows an increase in the amount of light extraction from the LED chip and therefore enhances its efficacy. This embodiment can be implemented for an LED filament where light is scattered uniformly in space.

Preferably the method further comprises applying a reflective layer on at least a part of the one or more walls. The reflective layer preferably is a metal layer or multi-layer reflective coating.

Preferably the method further comprises introducing one or more wavelength conversion material into the one or more enclosures. The wavelength conversion material may be a phosphor, or a component selected from silicates, a garnet, a sulfide or quantum dot, or a combination thereof. The provision of these materials into one or more enclosures is advantageous because a reduced volume of the material is required because the dam formed by the walls retains only the amount of material needed. Since the enclosures are constructed as part of the LED chip, no unnecessary clearance is needed.

The use of a phosphor is the most preferred wavelength conversion material. Advantageously, the walls which are formed from the first substrate help to guide the light and this has been found to improve the colour over angle variation in the light output of white phosphor-converted LEDs.

Preferably there is more than one enclosure on the light-emitting device and at least two contain different wavelength conversion materials. This can be used to provide a range of emitted wavelengths and, therefore, a tuneable colour temperature for the light emitted. For example, a plurality of different phosphors can be contained in separate enclosures on the light-emitting surface to produce a light which is closer to full-spectrum daylight.

Preferably the method further comprises at least partially filling at least one enclosure with a transparent material. The transparent material can be provided to protect the LED, but can also be used to act as a lens for the light emitted. The ability to form the lens directly on the light emitting surface is advantageous because it allows the design of low profile lighting products without requiring secondary optics. The lens also allows for easy customisation of the optics. In addition, the optics are compact and can be accurately placed and fabricated in a very cost efficient manner; applying standard secondary optics can result in alignment issues and result in a bulkier device.

The transparent material may comprise an epoxy or silicone material. The transparent material may further comprise the wavelength conversion material. When forming a lens the upper surface of the transparent material may be curved, such as parabolic in form.

As will be appreciated, when the enclosures are used to retain light conversion materials or LEDs, there is a considerable saving in manufacturing costs for the production of a final LED because you do not need to include these as extra components for the finished device.

Preferably the step of selectively etching the first substrate from the LED structure provides the first surface of the LED structure with a surface texture and/or wherein the step of selectively etching the second substrate from the LED structure provides the second surface of the LED structure with a surface texture. Alternatively the surface may be etched in a separate processing step to form the texture, such as a step of crystallographic PEC etching or photonic crystal structuring. The provision of a surface texture helps aid the emission of light from the LED structure. Such surface textures to aid light-emission are well known in the art.

Preferably the method comprises forming an array of LED structures and a step of dividing the array into separate LED chips.

Preferably the separate LED chips described herein have a width (diameter) of less than 2 mm, preferably less than 1.5 mm, and preferably from 1 to 0.3 mm, more preferably from 0.6 to 0.4 mm.

Preferably the method comprises applying secondary optics to the one or more walls. Secondary optics include reflectors and total internal reflection lenses. These can be used to collimate light and may be referred to as collimators. Secondary optics are so-called because they are distinct from the primary optics provided by the LED chip and walls.

Conventional secondary optics are many times larger than the LED chip size because the relatively large size of the LED package prevents secondary optics from being placed in close proximity of the LED chip. For non-packaged LED chips, as in the case of chip on board assembly, smaller size secondary optics can be used, but high alignment accuracy is required. A misalignment between the small-size secondary optics and an LED chip results in a noticeable deviation from the designed beam pattern and also a considerable reduction in light coupling efficiency.

Advantageously, the walls produced by the method described herein, provide an ideal attachment point for secondary optics. Moreover, the one or more walls hold the secondary optics in alignment with the first surface. This facilitates the alignment of the optics and permits the use of much smaller secondary optics than has conventionally been possible. That is the present invention allows miniaturized on-board secondary optics to be coupled to the LED chip with an optical efficiency of up to 95%. The miniaturized on-board secondary optics such as total internal reflection lenses can be made from PMMA, silicone, or glass, and can be designed to achieve a high level of optical coupling.

By mean of an example, a total internal reflection lens of a diameter as small as 4 mm with a height of 2 mm can be coupled efficiently to an LED chip of 1.5 mm by 1.5 mm size. Preferably the secondary optics have a lens diameter less than 5 times a diameter of the LED chip, more preferably from 1 to 3 times the diameter. It should be appreciated that the term diameter, as used herein, also includes the width of a square or rectangular chip (i.e. it is the shortest width, or the diameter of a circle fitting entirely within the footprint of the chip). In comparison, for similar coupling performances and beam emission pattern a 1.5 mm by 1.5 mm LED chip in a packaged device would couple to a total internal reflection lens of 9 mm diameter and 8 mm height.

Preferably the secondary optics have a height less than 5 times the height of the one or more walls, preferably less than 2 times. Suitable heights are less than 2 mm, preferably less than 1.5 mm.

The secondary optics can be attached with an adhesive. Suitable adhesives are well known in the art. Alternatively, the secondary optics can be held with a mechanical fixture such as a clip which can achieve a snap-fit.

According to a further aspect there is provided a light-emitting diode (LED) chip comprising an LED structure having a first surface and a second surface which is opposite the first surface, wherein the first surface is for the emission of light, and wherein one or more silicon walls are provided on the first surface for directing the light emitted.

Preferably the second surface is adjacent a substrate. That is, preferably the LED structure includes a supporting substrate. Alternatively, one or more silicon walls are provided on the second surface for directing the light emitted. That is, there is not provided a continuous supporting substrate and light generated in the LED structure can leave through top and bottom surfaces of the LED chip.

Preferably the one or more walls form one or more enclosures on the first surface as described above. Preferably the walls widen, or taper, away from the LED structure. Preferably the walls define a recess which extend to the LED structure. Preferably the one or more walls form one or more enclosures which are provided with a reflective coating on an internal surface.

Preferably the one or more walls form one or more enclosures contain one or more wavelength conversion materials.

Preferably the chip further comprises a transparent material at least partially within the one or more enclosures. This may preferably be in the form of a lens.

According to a further aspect there is provided a light-emitting diode chip obtainable by the method described herein.

According to a further aspect there is provided a device comprising a light-emitting diode chip described herein.

The LED chip described herein is preferably for use in a device such as camera flashes, such as for a camera or a smart-phone or tablet or the like, or for focussed lighting such as under-counter lights or car headlights.

According to a preferred embodiment there is provided a method for the manufacture of a light-emitting diode (LED) chip, the method comprising: providing a first substrate; forming an LED structure on the first substrate, wherein the LED structure has a first surface adjacent the first substrate and a second surface opposite the first substrate; applying a second substrate on the second surface of the LED structure; and selectively etching the first substrate from the LED structure to form one or more walls extending from the first surface of the LED structure, the method further comprising a step of selectively etching the second substrate from the LED structure to form one or more walls extending from the second surface of the LED structure, and wherein the step of selectively etching the first substrate from the LED structure provides the first surface of the LED structure with a surface texture and wherein the step of selectively etching the second substrate from the LED structure provides the second surface of the LED structure with a surface texture.

According to a preferred embodiment there is provided a method for the manufacture of a light-emitting diode (LED) chip, the method comprising: providing a first substrate; forming an LED structure on the first substrate, wherein the LED structure has a first surface adjacent the first substrate and a second surface opposite the first substrate; applying a second substrate on the second surface of the LED structure; and selectively etching the first substrate from the LED structure to form one or more walls extending from the first surface of the LED structure, wherein the method comprises applying secondary optics to the one or more walls, whereby the one or more walls hold the secondary optics in alignment with the first surface. Preferably the secondary optics have a lens diameter less than 5 times a diameter of the LED chip and a height of less than 2 times the diameter of the LED chip. Preferably the secondary optics are adhered with an adhesive.

The invention will now be described in relation to the following non-limiting figures. Further advantages of the disclosure are apparent by reference to the detailed description when considered in conjunction with the figures, which are not to scale so as to more clearly show the details, wherein like reference numbers indicate like elements throughout the several views.

FIGS. 2A-2D show stages in the manufacture of an LED chip (200). In a first stage, layers are deposited to provide the light emitting structure of the LED chip (200); these are formed of GaN grown on a first substrate (205) which is made from silicon. The GaN layers comprise an n-type doped GaN layer (210) upon the first substrate (205), a layer (215) comprising a plurality of quantum wells on the n-type doped GaN layer (210) and a p-type doped GaN layer (220) on the layer (215) comprising a plurality of quantum wells.

The fabrication of the light emitting structure further includes the introduction of electrical contacts. An etching step permits the formation of an "n-GaN" electrical contact (225) which is so-called because it is in contact with the n-type doped GaN layer (210). Sidewall passivation (230) is provided on the "n-GaN" electrical contact to ensure that it is insulated from the other layers of the light emitting structure. A reflective "p-GaN" electrical contact (235) is made which is so-called because it is provided in electrical contact with the p-type doped GaN layer (220).

A second substrate (240) in the form of a wafer made from silicon, is bonded to the fabricated GaN structure using a permanent, conductive adhesive (245). The second substrate (240) is applied to the sidewall passivation (230) and the "p-GaN" electrical contact (235).

The fabricated GaN structure is flipped over and processed. The first substrate (205), which is the original growth substrate, is selectively removed by printing a pattern in a photo sensitive media, then etching the silicon using a wet etch chemistry or a dry etch chemistry, such as ICP or RIE etching, or a combination of wet and dry etch chemistries. The selective etching ensures that the first substrate (205) includes wells extending from surface of the exposed n-type doped GaN layer (210) bounded by sidewalls (206). The etching can be continued until a textured surface (250) is formed on the exposed n-type doped GaN layer (210).

The sidewalls (206), made of the selectively retained silicon, can be shaped such they are vertical, sloped or curved in a parabolic, spherical or similar way. The inner surfaces (207) of the sidewalls (206) can be coated in a reflective metal.

Figure 3A:
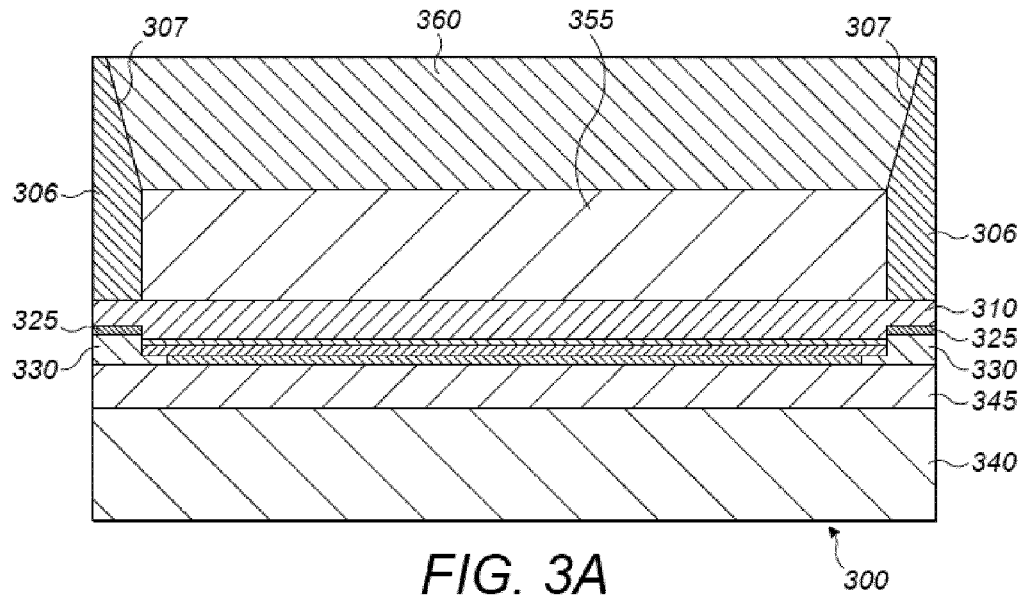
FIGS. 3A and 3B show cross-sections of final structures for an exemplary LED chip.
Figure 3B:
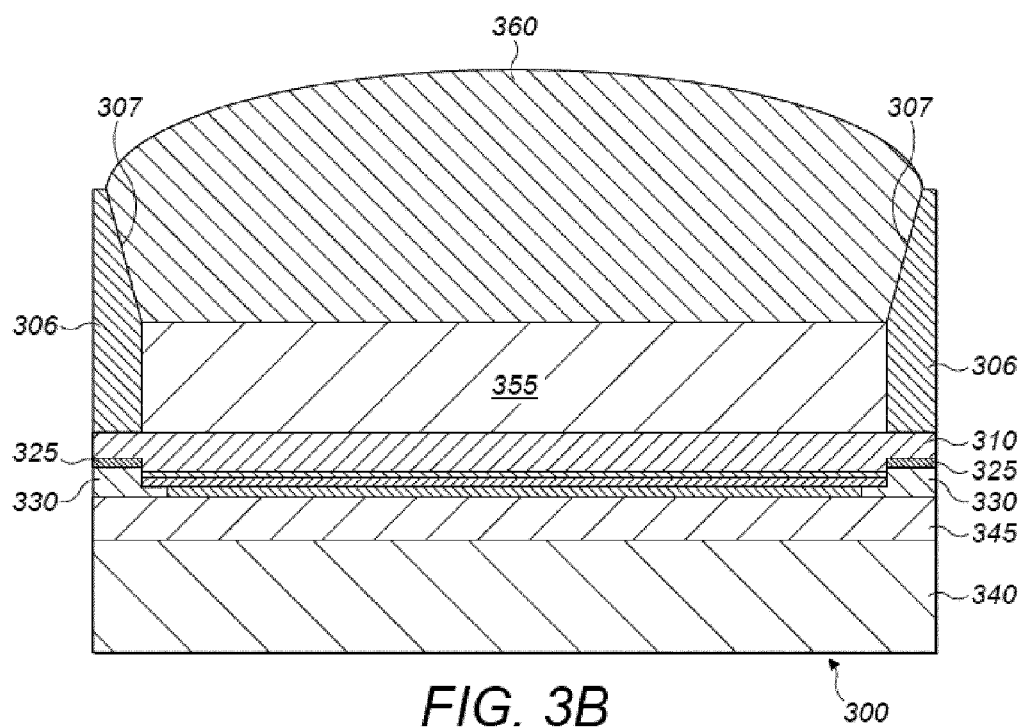

The well formed by selectively etching the original growth substrate (205) can be used to confine applied phosphor (255). Since the phosphor is confined so closely to the light emitting surfaces, a reduced volume of phosphor is required. GaN on silicon emits light from a surface; there is no sideways emission, so phosphor is only required to coat the surface of the exposed LED structure, thus reducing the quantity of phosphor required FIGS. 3A and 3B show LED chips (300) having a similar structure to that shown in FIGS. 2A-C. Related reference numerals relate to the same portion of the structure, e.g. first substrates (205, 305). The method of manufacture and the ordering of the layers being formed correspond to the method described above.

In FIG. 3A, the selective etching of the first substrate (305) provides walls (306) which bound portions of a light emitting surface of the n-type doped GaN layer (210). The walls (306) bound an area that can be divided from the LED chip (300), after production, to provide a single LED device. This is because the LED chip (300) will typically, for manufacturing expediency and efficiency, include a plurality of portions intended for forming separate LED devices.

Once electrical connections have been formed onto the singulated portions, the LED device can be used in an electronic device.

The well formed by selectively etching the original growth substrate can be fabricated to a predetermined depth to provide a controlled amount of phosphor (355) to be applied for a given end-use, and allow, if desired, for a transparent material (360) to be formed on top of the phosphor (355). The transparent material can be flat as shown in FIG. 3A, or domed as shown in FIG. 3B to form a lens, to aid light extraction efficiency. The sidewall (306) may be shaped so that at least a portion of the inner wall (307) can be used to collimate or shape the light emitted from the LED device in use.

Figure 4A:
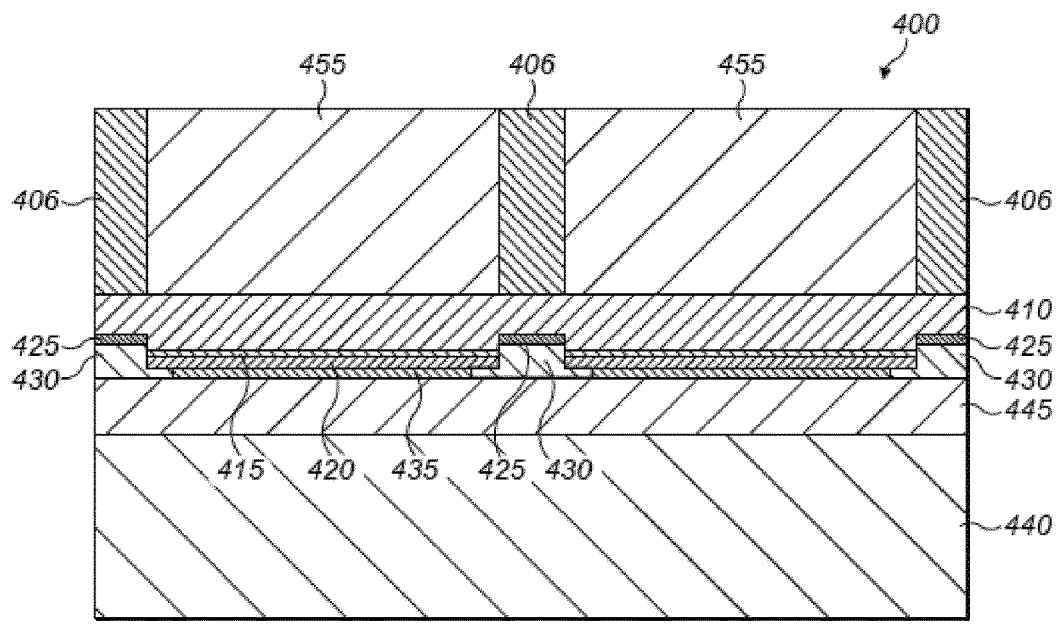
FIGS. 4A and 4B show final structures for an exemplary LED chip including multiple enclosures holding phosphors and a transparent material.
Figure 4B:
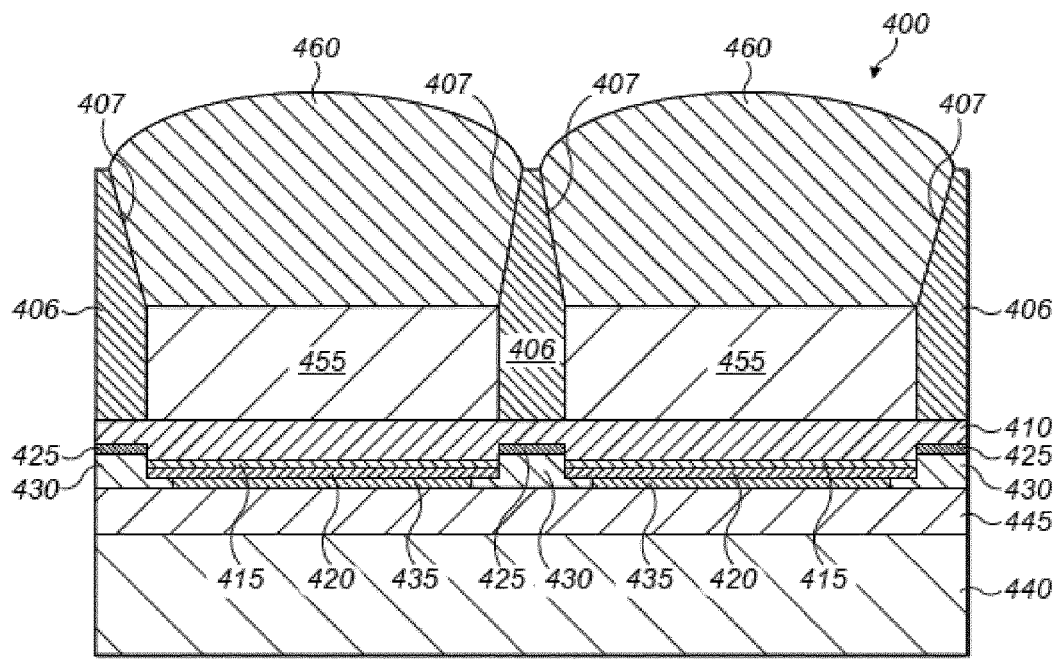

FIGS. 4A and 4B show LED chips (400) having a similar structure to that shown in the foregoing Figures. Related reference numerals relate to the same portion of the structure, e.g. first substrates (205, 305, 405). The method of manufacture and the ordering of the layers being formed correspond to the method described above.

The LED chip (400) may be divided into separate LED components each having a perimeter wall as shown in FIGS. 3A and 3B. Alternatively, the LED chip may be divided into separate LED components having two or more separate enclosures provided on the light emitting surface. The provision of two or more enclosures permits the use of two or more different types of phosphor (455) or different types of transparent material (460). The use of multiple phosphors (455) permits tunable colour temperature of the final device.

Figure 5A:
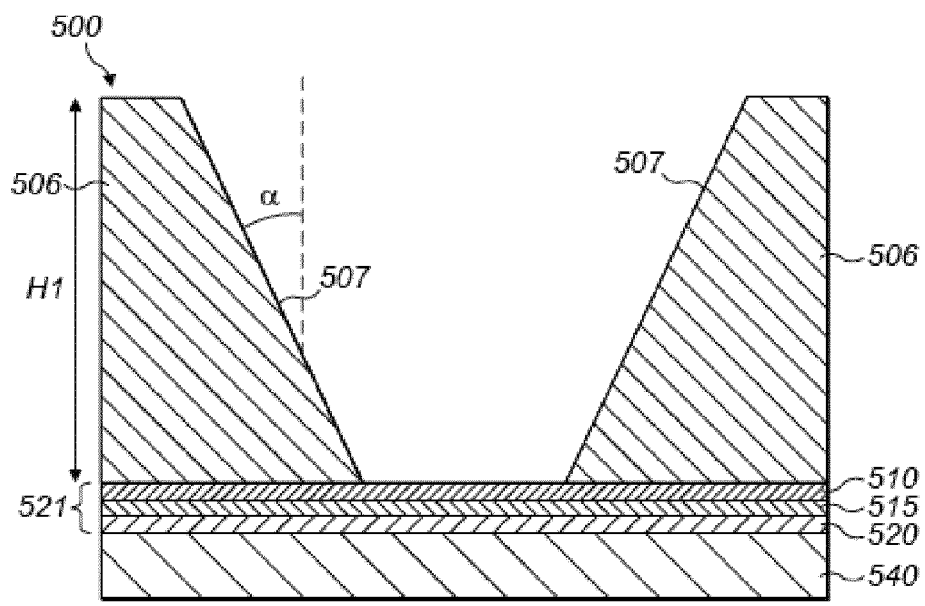
FIG. 5A shows a final structure for an exemplary LED chip.

FIGS. 5A and 4B shows an LED chips (500) having a similar structure to that shown in the foregoing structural Figures. Related reference numerals relate to the same portion of the structure, e.g. first substrates (205, 305, 405). The method of manufacture and the ordering of the layers being formed correspond to the method described above.

In FIG. 5A the structure shown has been simplified for clarity. That is, the electrodes structure has not been shown but is, of course, present. The structure shown involves therefore a simplified three layer LED structure (521) including the n-type doped GaN layer (510), the layer (515) comprising a plurality of quantum wells and a p-type doped GaN layer (520).

FIG. 5A therefore shows a light emitting diode which consists of an epitaxy layer of Gallium Nitride forming the LED structure (521) bonded to two layers of silicon material (540, 506). The original silicon substrate (505—not shown), has been processed to uncover a surface area of the n-type doped GaN layer (505) so the emitted light emerges through surface area between the walls (506) formed from the remaining silicon.

The emitted light is also reflected by the inners surfaces (507) of the walls (506). The reflectivity of the inner surfaces (507) can be enhanced by using Aluminium, Silver coating, or a multi-layer reflection coating.

The height H1 of the silicon walls (506), which corresponds to the thickness of the original first substrate (505), is typically between 100 to 900 microns. The light distribution pattern is governed by the height H1, the shape of inner surfaces (507) and the optical surface finish of the inner surfaces (507). The shape of the inner surfaces (507) can be, but are not limited to, conical, parabolic, elliptical or a compound parabolic surface.

In FIG. 5A the inner surfaces (507) of the walls (506) form a regular truncated cone with apex angle α (at an angle normal to the light emitting surface) and a height H1. The inner surfaces have a mirror finish.

Figure 5B:
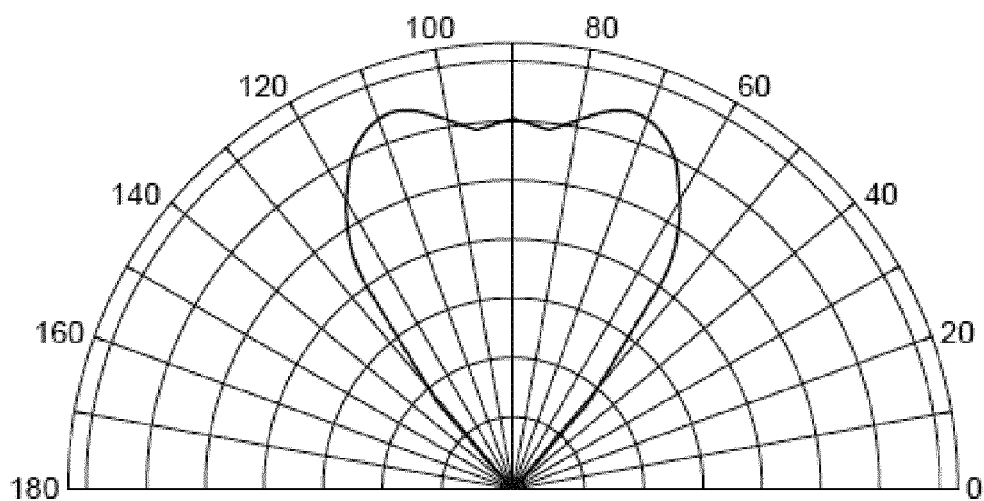
FIG. 5B shows the light distribution pattern observable with the structure shown in FIG. 5A.

FIG. 5B relates to the light distribution pattern obtained with a truncated cone reflector of an apex angle α=20 degrees, a height H1=210 microns and an uncovered circular surface area of 150 microns radius.

Figure 6:
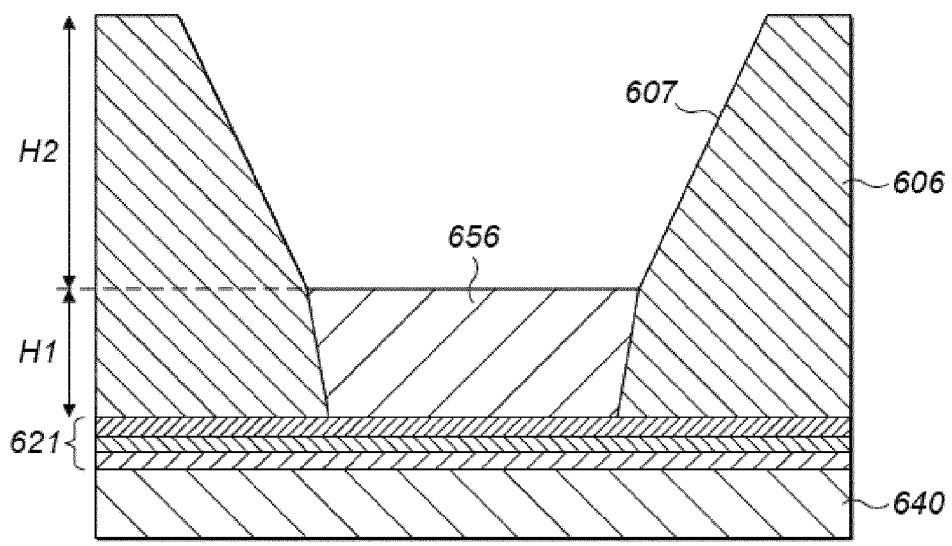
FIG. 6 show a cross-section of a final structure for an exemplary LED chip.

FIG. 6 shows an embodiment wherein the processed silicon first substrate (605) has been is shaped to form walls (606) with inner surfaces (607) which perform both as a reflector and as a dam containing an encapsulated material (656) with a height H1.

The reflectivity of the inner surfaces (607) are enhanced by using aluminium, silver coating, or a multi-layer reflection coating. The encapsulated material (656) can be made of silicone, epoxy material or other translucent material grades. The encapsulated material (656) can contain wavelength converting phosphor materials. The resulting light distribution pattern is controlled by changing the shape and angles of the inner surfaces (607) and the height H2.

Figure 7A:
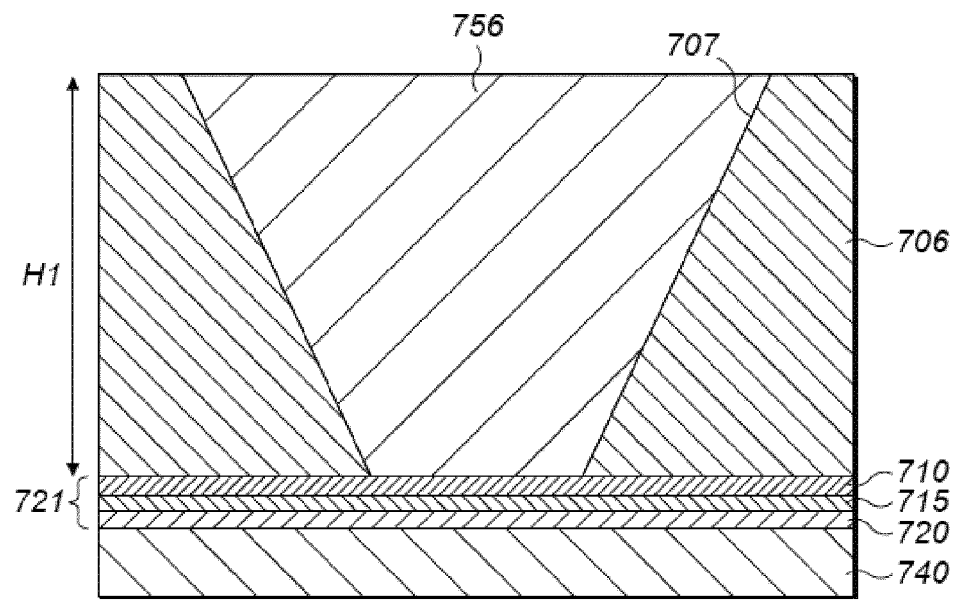
FIG. 7A show a cross-section of a final structure for an exemplary LED chip.

The structure of FIG. 7A is similar to that of FIG. 6, except that the enclosure formed by the walls (706) is filled with encapsulated material (756). The encapsulated material (756) can also be made of two or more layers, as shown in the earlier figures. The height H1 of the walls (706) is typically between 100 to 1000 microns.

Figure 7B:
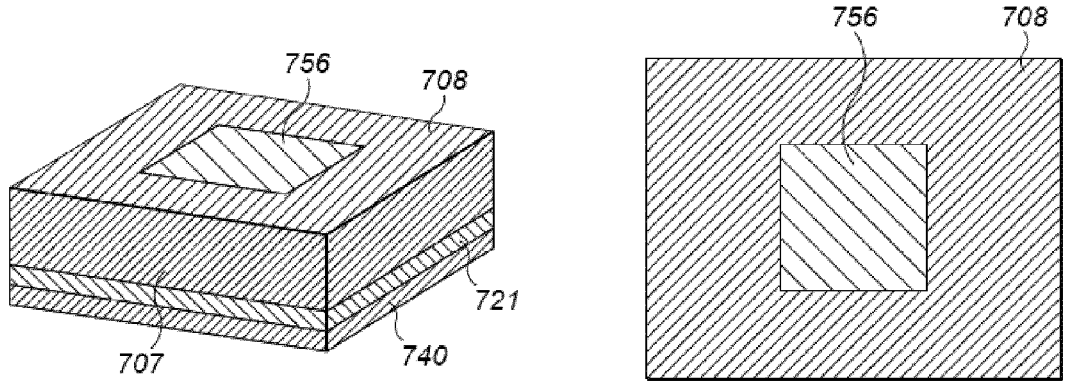
FIG. 7B shows a perspective view of the same chip and a top-down view showing the light emitting area within the enclosure formed by the walls.
Figure 7C:
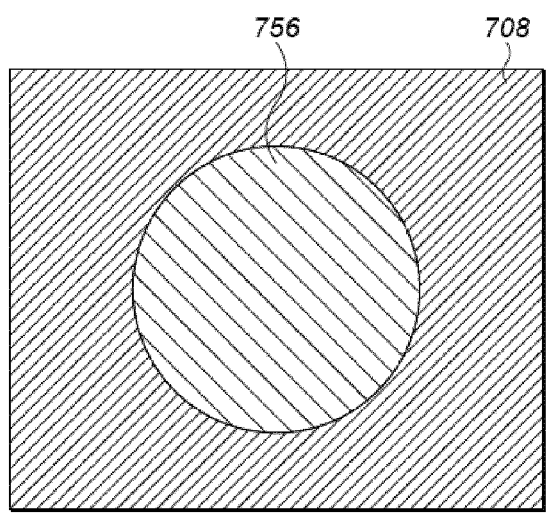
FIGS. 7C and 7D show alternative top-views for different configurations of the walls on the device.
Figure 7D:
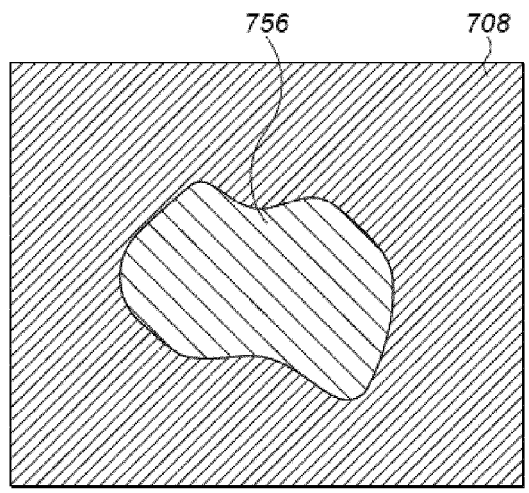

The outline formed by the top of the enclosing walls (706) around the top of the encapsulated material (756) can be of a regular shape such as depicted in FIG. 7B and FIG. 7C, or irregular as illustrated in FIG. 7D.

Figure 7E:
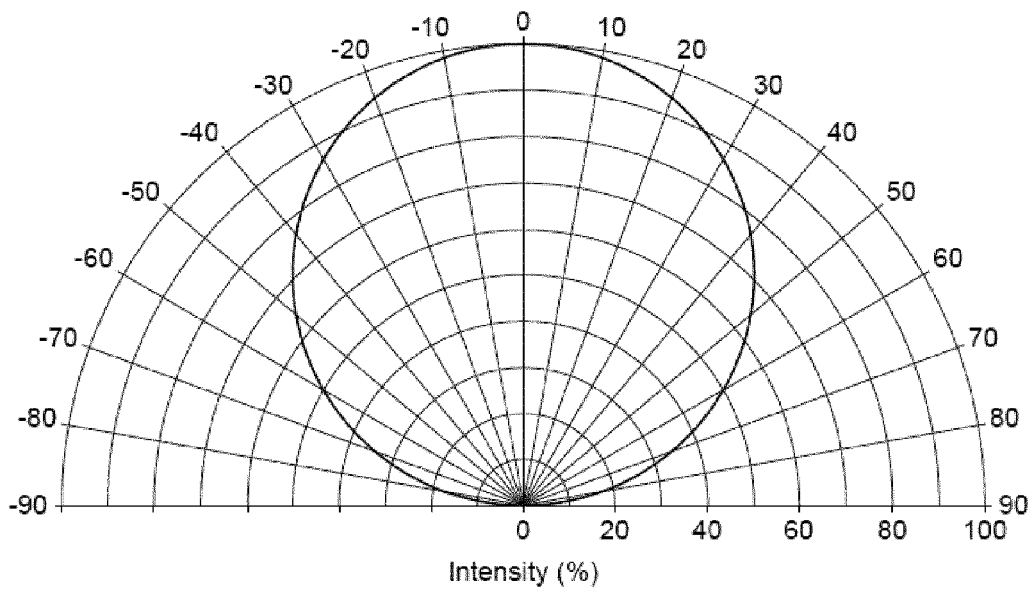
FIG. 7E shows the light distribution pattern in two dimensions for the device of FIGS. 7A and 7B.

FIG. 7E shows the light distribution pattern corresponding to a single layer of encapsulant containing phosphor wavelength-converter where the angle at full width half maximum is 120 degree.

Figure 8:
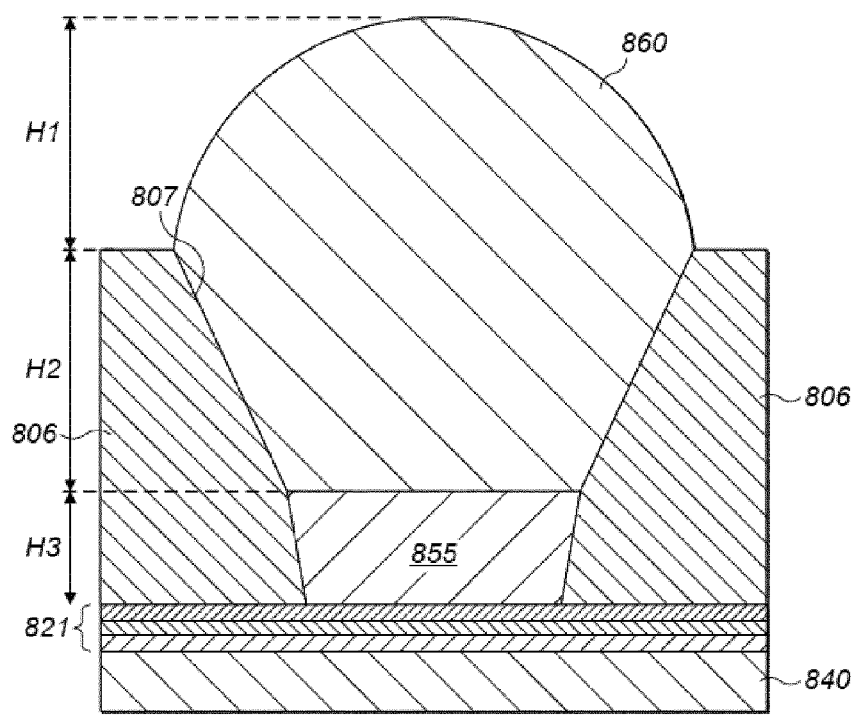
FIG. 8 show a cross-section of a final structure for an exemplary LED chip having a convex lens.

In FIG. 8 the silicon first substrate (805) is processed to provide walls (806) which perform as a dam to contain the encapsulated material. The encapsulated material is made of two layers: a phosphor layer (855) and a transparent material (860). The transparent material (860) is a clear translucent material and the phosphor layer (855) of height H3 contains a phosphor wavelength converting material. Height H4 of the transparent material (860) forms a micro-lens in order to enhance the light extraction from the LED but it also allows control of the beam angle. The lens shape is preferably spherical but it can also be of aspherical geometry depending on the light beam desired.

Figure 9:
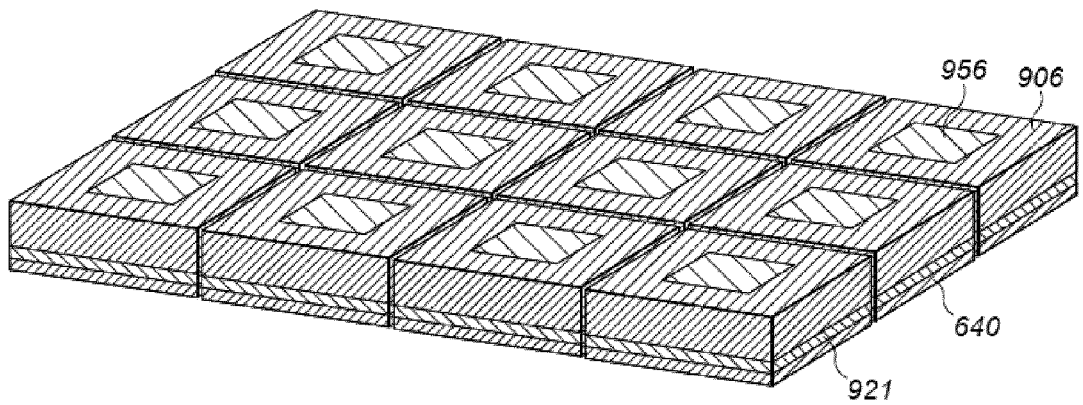
FIG. 9 shows a perspective view of an LED device formed of a plurality of LED chips as described herein.

FIG. 9 shows an LED chip (900) which comprises an array of enclosures, bounded by walls (906) and filled with an encapsulated material (956), obtained by processing the silicon first substrate (905). Each individual enclosure can contain phosphor wavelength converting material, preferably a selection of different phosphors. Each individual enclosure can be individually addressable. Although not shown here, the silicon first substrate (905) can also be processed so that each individual enclosure has different geometry: therefore each individual enclosure emits different beam light pattern.

Figure 10A:
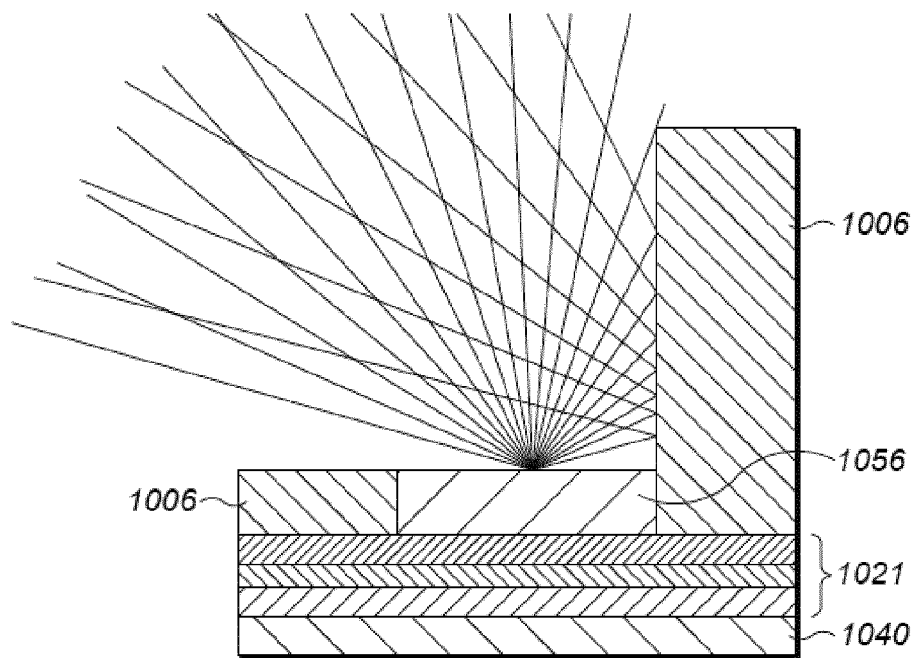
FIG. 10A shows a simplified cross-section of a final structure for an exemplary LED chip having a single wall.
Figure 10B:
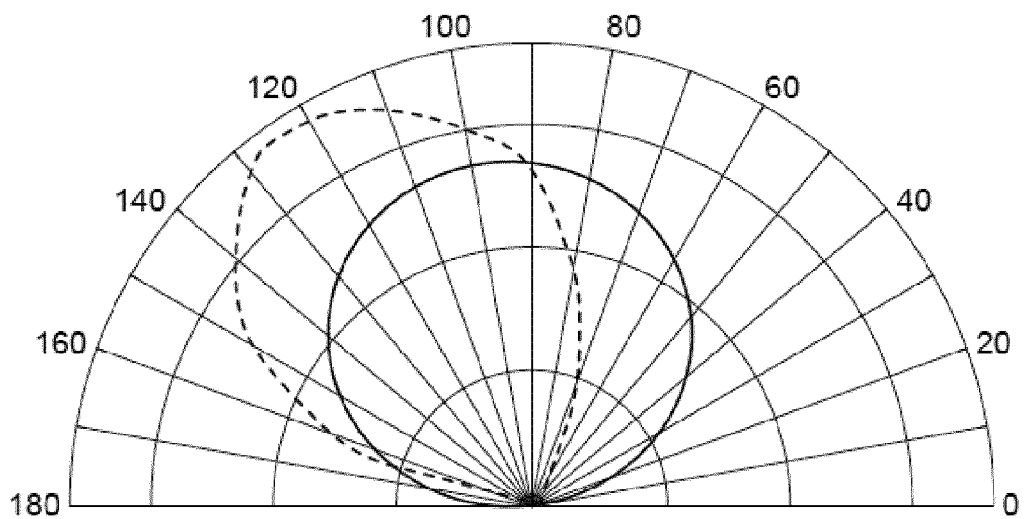
FIG. 10B shows the light distribution pattern observable with the structure shown in FIG. 10A.

In FIG. 10A there is shown an embodiment where the silicon first substrate (1005) is processed to form a dam to contain an encapsulated material (1056) and also to reflect partially the light emitted by the LED chip. The resulting beam angle is asymmetric as show in FIG. 10B. This particular beam pattern is desirable for accent lighting applications and under-cabinet lighting for instance.

Figure 11A:
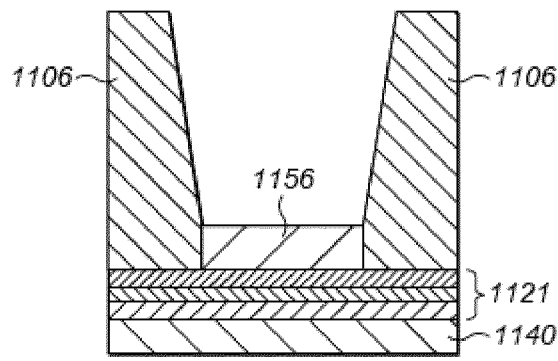
FIG. 11A shows a cross-section of a final structure for an exemplary LED chip.
Figure 11B:
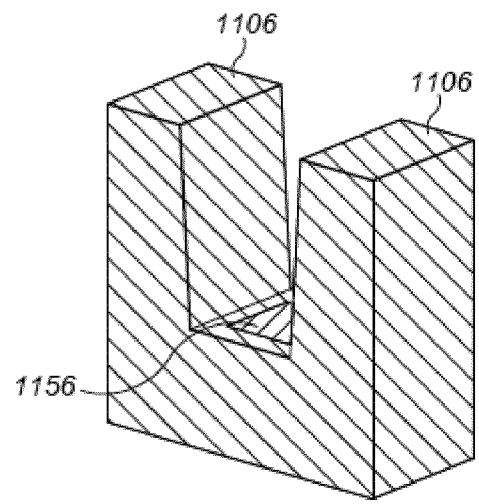
FIG. 11B shows a perspective view of a simplified version of the structure in FIG. 11A, showing the location of the walls.
Figure 11C:
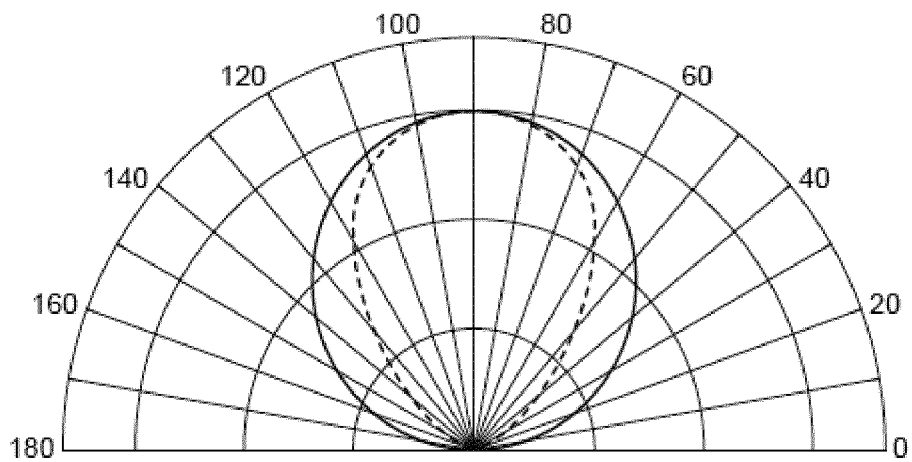
FIG. 11C shows the light distribution pattern observable with the structure shown in FIGS. 11A and 11B.

FIGS. 11A and 11B correspond to an LED chip having the silicon first substrate (1005) processed to form a dam to contain the encapsulated material (1056) and also to reflect partially the emitted light by the LED chip using two opposite reflectors. For inner surfaces (1007) having a mirror-quality polish, the resulting beam pattern is asymmetric as show in FIG. 11C which is desirable for general lighting.

FIG. 12 corresponds to an LED chip having both the silicon first substrate (1005) and the second substrate (1240) processed so that the light generated within the LED structure (1221) can escape from both opposite sides, the upward direct and the downward direct. This embodiment allows an increase in the amount of light extraction from the LED chip and therefore enhances its efficacy. This embodiment can be implemented for an LED filament where light is scattered uniformly in space.

Figure 13:
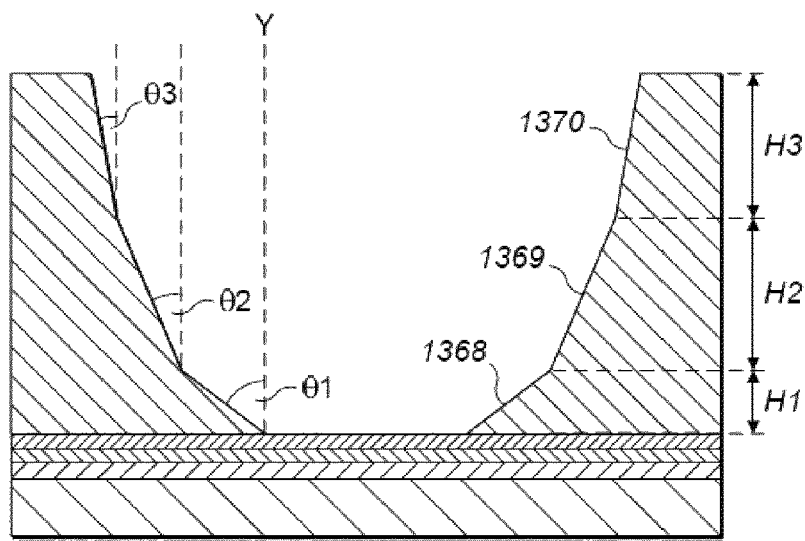
FIG. 13 shows a simplified cross-section of a final structure for an exemplary LED chip with a varying internal wall angle.

The previous embodiments disclosed examples of sidewalls consisting of a single or two straight segments. FIG. 13 illustrates a light-guide reflector having three straight segments (1368, 1369 and 1370), creating angles θ1, θ2, θ3 with the axis Y normal to the surface.

The segments S1, S2 and S3 are of heights H1, H2 and H3 respectively, making angles θ1>θ2>θ3. These can be changed to achieve a desired convex sidewall shape. The light-guide reflector of this disclosure can be of other shapes having any number of straight and/or curved segments connected with each other to form a complete convex sidewall that extends from the lower diameter to the upper diameter of the light-guide reflector in order to direct light away from surface and to achieve partially or highly collimated light.

That is, the embodiment of FIG. 13 shows walls which have at least two wall segments including an upper wall segment and a lower wall segment and the upper segment has a reduced taper compared to the lower segment. This allows for greater focusing and collimating of the light produced.

Figure 14:
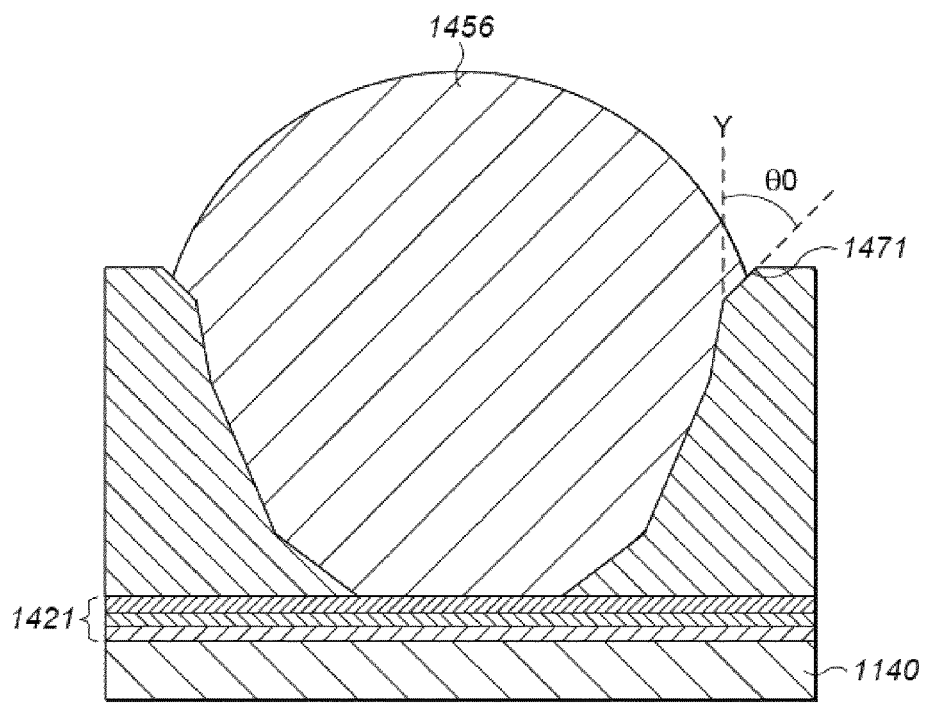
FIG. 14 shows a simplified cross-section of a final structure for an exemplary LED chip having a lens.

FIG. 14 illustrates a light guide reflector combined with an encapsulated material (1456) forming a spherical or aspherical lens to increase the amount of light extracted for the LED and can also be designed to enhance its directionality.

Compared to FIG. 13, a straight sidewall segment (1471) is added making an angle θ0 with the axis Y that is perpendicular to the light emitting surface. This embodiment contains an encapsulated material (1456) forming a lens with a radius R. The radius of curvature R is dependent of the total volume of the encapsulated material (1465) and the angle θ0. Hence varying the angle θ0 will vary the radius of curvature of the lens because of the surface tension.

That is, in the embodiment of FIG. 14 the walls have at least two wall segments including an upper wall segment and a lower wall segment and the upper segment has a larger taper than the lower segment. That is, the opening widens in the top segment since this helps to tune the radius of curvature when forming a lens.

As used herein, the term encapsulated material (1456) includes one or both of a wavelength conversion material such as a phosphor (1444) and a transparent material (1460).

Figure 15:
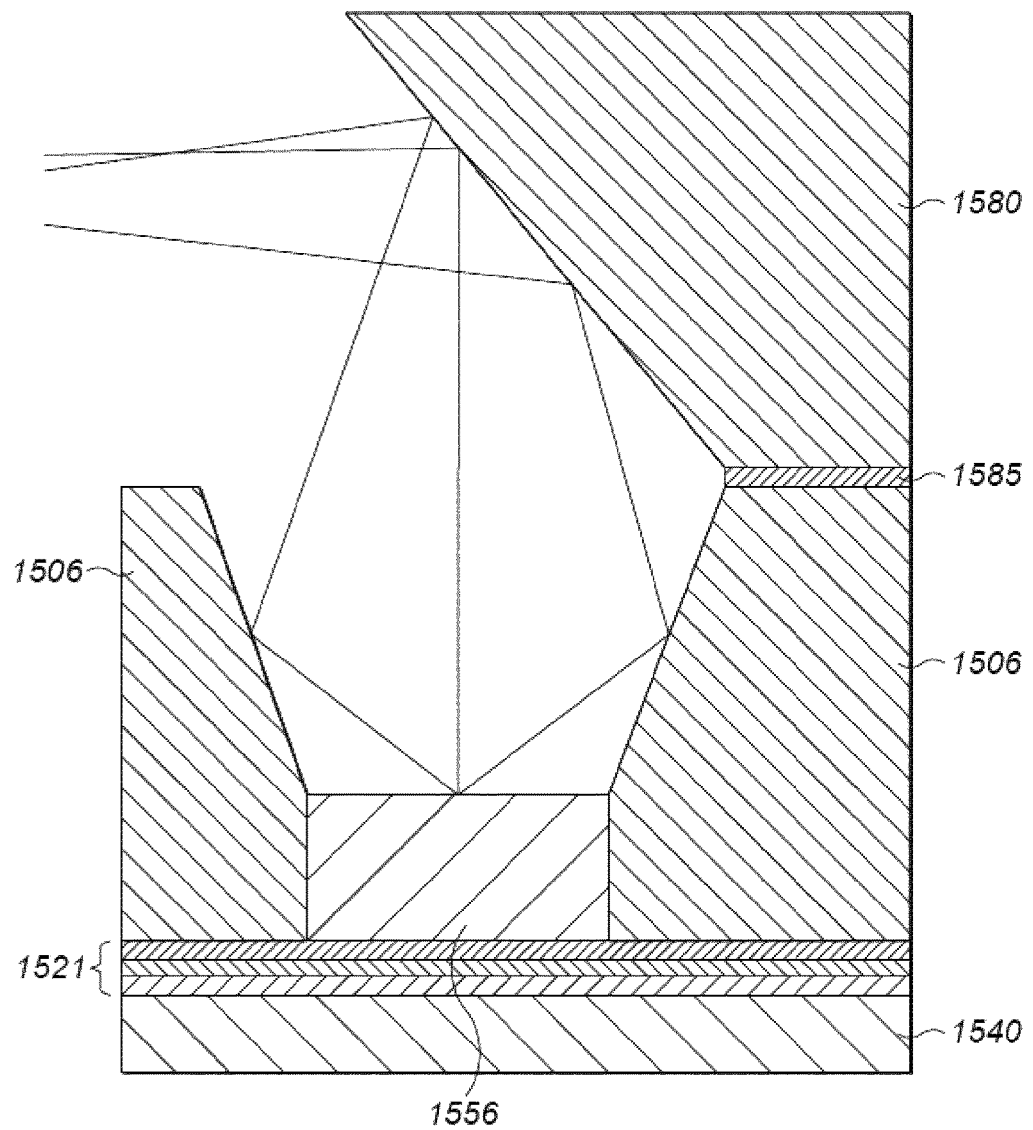
FIG. 15 shows an alternative design for providing focussed angled light, which is perpendicular to the original direction of the emitted light.

FIG. 15 shows an embodiment of a device similar to that of FIG. 11A. However, in this embodiment a further silicon light guide 1580 is adhered with an adhesive 1585 to at least a portion of the one or more walls 1506. This may have a reflective coating applied so that the light emitted can be reflected out of the original orientation of the light.

Figure 16:
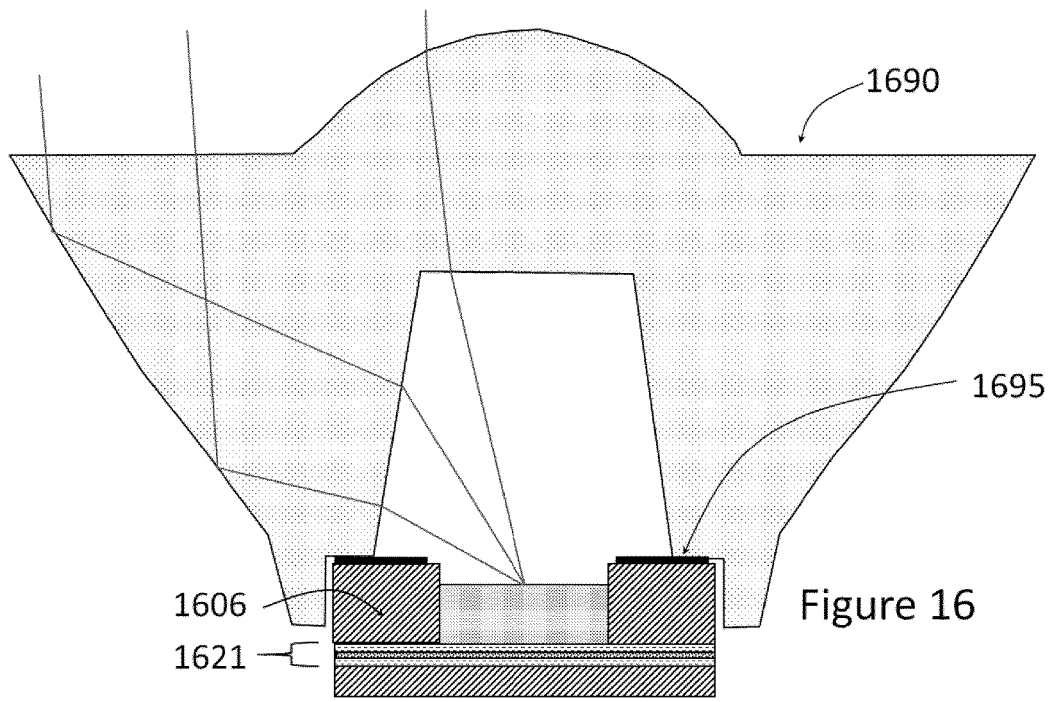
FIG. 16 shows an alternative design for providing focussed light, relying on the provision of secondary optics.

FIG. 16 shows an embodiment of a device similar to that of FIG. 11A. However, in this embodiment, secondary optics 1690 have been adhered with an adhesive tape 1695 to at least a portion of the one or more walls 1606. This may have a reflective coating applied so that the light emitted can be reflected out of the original orientation of the light. The secondary optics may be a total internal reflection lens, such as one made from polymethylmethacrylate (PMMA), Silicone or glass. The walls provide a mechanical support to hold and align accurately the miniaturized lens to the LED chip.

Figure 17:
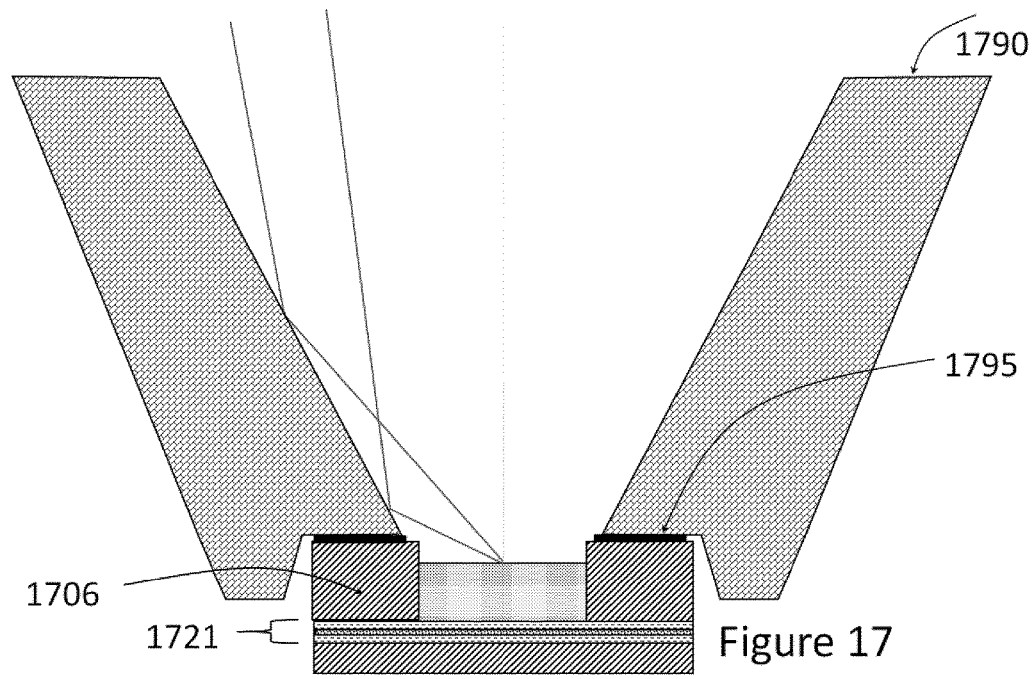
FIG. 17 shows an alternative design for providing focussed light, relying on the provision of secondary optics.

FIG. 17 shows an embodiment of a device similar to that of FIG. 11A. However, in this embodiment, secondary optics 1790 have been adhered with an adhesive tape 1795 to at least a portion of the one or more walls 1706. The secondary optics 1790 is a reflector cone to collimate the emitted light. The secondary optics may, alternatively, be snap-fit or clipped to the LED chip.

Although preferred embodiments of the invention have been described herein in detail, it will be understood by those skilled in the art that variations may be made thereto without departing from the scope of the invention or of the appended claims.

The invention claimed is:

1. A method for the manufacture of a light-emitting diode (LED) chip, the method comprising:
   providing a first substrate;
   forming an LED structure on the first substrate, wherein the LED structure has a first surface adjacent the first substrate and a second surface opposite the first substrate;
   applying a second substrate on the second surface of the LED structure;
   selectively etching the first substrate from the LED structure to form one or more walls extending from the first surface of the LED structure; and
   selectively etching the second substrate from the LED structure to form one or more walls extending from the second surface of the LED structure.

2. A method according to claim 1, wherein the LED structure comprises a light emitting layer disposed between a p-type layer and an n-type layer and preferably wherein the p-type layer and/or the n-type layer comprises doped GaN.

3. A method according to claim 1, wherein the method further comprises applying a reflective layer on at least a part of the one or more walls.

4. A method according to claim 1, wherein the one or more walls form one or more enclosures on the first surface.

5. A method according to claim 4, wherein the method further comprises introducing one or more wavelength conversion material into the one or more enclosures; and/or
   wherein the method further comprises at least partially filling at least one enclosure with a transparent material.

6. A method according to claim 1, wherein the step of selectively etching the first substrate from the LED structure provides the first surface of the LED structure with a surface texture and/or wherein the step of selectively etching the second substrate from the LED structure provides the second surface of the LED structure with a surface texture.

7. A method according to claim 1, wherein the method comprises forming an array of LED structures and a step of dividing the array into separate LED chips.

8. A method according to claim 1, wherein the method comprises applying secondary optics to the one or more walls.

9. The method according to claim 8, wherein the secondary optics have a lens diameter less than 5 times a diameter of the LED chip.

10. The method of claim 1 wherein the light-emitting diode (LED) chip comprises:

said LED structure which has said first surface and said second surface which is opposite the first surface, wherein the first surface is for the emission of light, and wherein one or more silicon walls are provided on the first surface for directing the light emitted.

11. The method of claim 10 wherein the second surface is adjacent a substrate; or
wherein one or more silicon walls are provided on the second surface for directing the light emitted.

12. The method of claim 10, wherein the one or more walls form one or more enclosures on the first surface and,
wherein the chip further comprises a lens at least partially within the one or more enclosures.

13. The method of claim 10, wherein the walls taper away from the LED structure; and/or
wherein the walls define a recess which extend to the LED structure.

14. The method of claim 12, wherein the one or more walls which form one or more enclosures:
(i) are provided with a reflective coating on an internal surface;
and/or
(ii) contain one or more wavelength conversion materials.

15. A light-emitting diode chip obtainable by the method of claim 1.

16. The method of claim 10 wherein the diode is a component of a device.

* * * * *